US012537166B2

(12) United States Patent
Bae et al.

(10) Patent No.: US 12,537,166 B2
(45) Date of Patent: Jan. 27, 2026

(54) INDUCTIVELY COUPLED PLASMA APPARATUS FOR EXHAUST GAS TREATMENT AND IMPEDANCE MATCHING METHOD THEREOF

(71) Applicant: LOT CES CO., LTD., Osan-si (KR)

(72) Inventors: Jin Ho Bae, Hwaseong-si (KR); Min Jae Kim, Ansan-si (KR); Sang Don Choi, Gunpo-si (KR)

(73) Assignee: LOT CES CO., LTD., Osan-si (KR)

(*) Notice: Subject to any disclaimer, the term of this patent is extended or adjusted under 35 U.S.C. 154(b) by 316 days.

(21) Appl. No.: 18/034,373

(22) PCT Filed: Feb. 9, 2022

(86) PCT No.: PCT/KR2022/001976
§ 371 (c)(1),
(2) Date: Apr. 27, 2023

(87) PCT Pub. No.: WO2022/177226
PCT Pub. Date: Aug. 25, 2022

(65) Prior Publication Data
US 2023/0377842 A1 Nov. 23, 2023

(30) Foreign Application Priority Data
Feb. 18, 2021 (KR) ........................ 10-2021-0021738

(51) Int. Cl.
*H01J 37/32* (2006.01)

(52) U.S. Cl.
CPC ...... *H01J 37/321* (2013.01); *H01J 37/32183* (2013.01); *H01J 37/32834* (2013.01); *H01J 37/32926* (2013.01)

(58) Field of Classification Search
CPC ............... H01J 37/321; H01J 37/32183; H01J 37/32834; H01J 37/32926
See application file for complete search history.

(56) References Cited

U.S. PATENT DOCUMENTS

2009/0255800 A1* 10/2009 Koshimizu ....... H01J 37/32091 422/186.29
2010/0200390 A1 8/2010 Ikeda et al.
(Continued)

FOREIGN PATENT DOCUMENTS

JP 2009-034674 A 2/2009
KR 10-0457632 B1 11/2004
(Continued)

OTHER PUBLICATIONS

International Search Report for PCT/KR2022/001976 mailed May 16, 2022 from Korean Intellectual Property Office.

*Primary Examiner* — Tung X Le
(74) *Attorney, Agent, or Firm* — Revolution IP, PLLC

(57) ABSTRACT

An inductively coupled plasma apparatus for exhaust gas treatment, includes: an inductively coupled plasma reactor installed on an exhaust pipe through which exhaust gas generated from a process chamber of a semiconductor manufacturing facility is discharged; a power supply configured to supply high-frequency power to the inductively coupled plasma reactor through a transmission line; and an impedance matching unit configured to match impedance of the inductively coupled plasma reactor with impedance of the power supply, wherein the impedance matching unit includes a variable power storage element, an operation data measuring instrument measuring operation data of the inductively coupled plasma reactor, and a controller stepwise adjusting total capacitance by the variable power storage element using an operation data sampling value obtained by the operation data measuring instrument in one operation cycle and reflecting the adjusted total capacitance on starting impedance matching in a next operation cycle.

11 Claims, 4 Drawing Sheets

(56) References Cited

U.S. PATENT DOCUMENTS

| | | | | |
|---|---|---|---|---|
| 2015/0000841 | A1 | 1/2015 | Yamada et al. | |
| 2019/0172683 | A1* | 6/2019 | Mavretic | H03K 17/691 |
| 2020/0126762 | A1* | 4/2020 | Yang | H01J 37/32183 |
| 2020/0218774 | A1* | 7/2020 | Howald | G06F 30/367 |
| 2021/0090859 | A1* | 3/2021 | Bhutta | H01L 21/32136 |

FOREIGN PATENT DOCUMENTS

| | | | |
|---|---|---|---|
| KR | 10-1145294 | B1 | 5/2012 |
| KR | 10-2015-0064722 | A | 6/2015 |
| KR | 10-2019-0019651 | A | 2/2019 |
| KR | 10-1993880 | B1 | 6/2019 |
| WO | 2020-185951 | A2 | 9/2020 |

* cited by examiner

【FIG. 1】
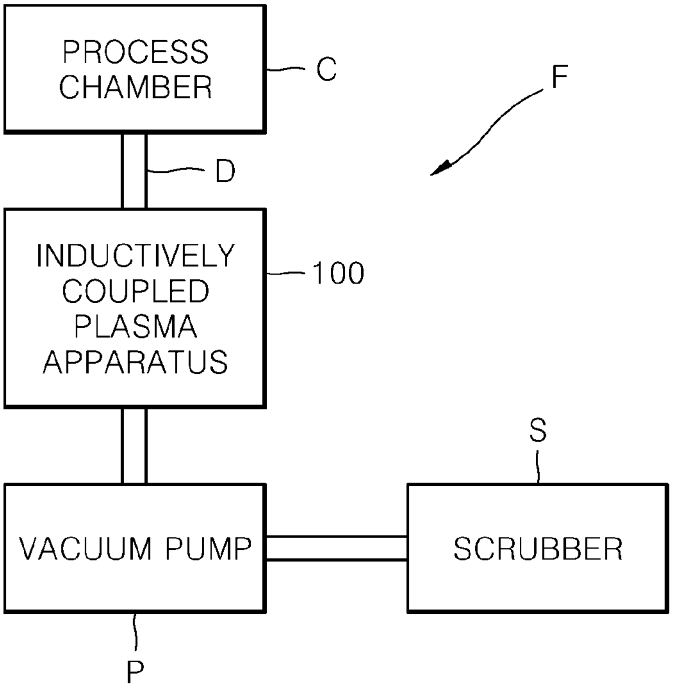

【FIG. 2】
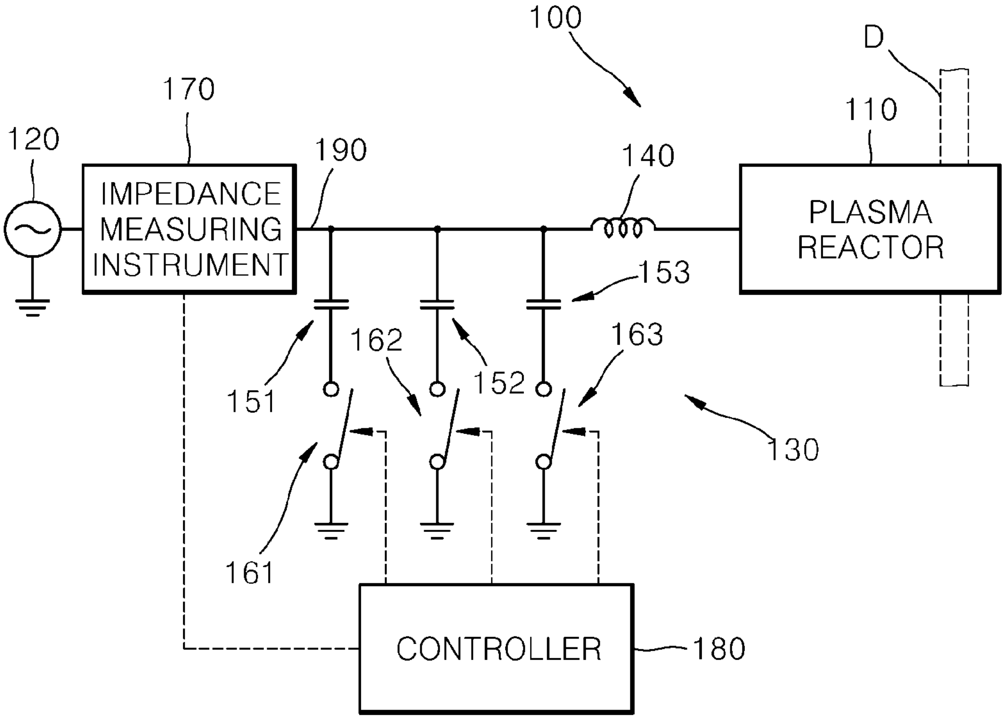

【FIG. 3】

| CASE | FIRST SWITCH | SECOND SWITCH | THIRD SWITCH | Total Capacitance |
|---|---|---|---|---|
| 1 | OFF | OFF | OFF | 0 |
| 2 | ON | OFF | OFF | C1 |
| 3 | OFF | ON | OFF | C2 |
| 4 | OFF | OFF | ON | C3 |
| 5 | ON | ON | OFF | C1+C2 |
| 6 | ON | OFF | ON | C1+C3 |
| 7 | OFF | ON | ON | C2+C3 |
| 8 | ON | ON | ON | C1+C2+C3 |

【FIG. 4】
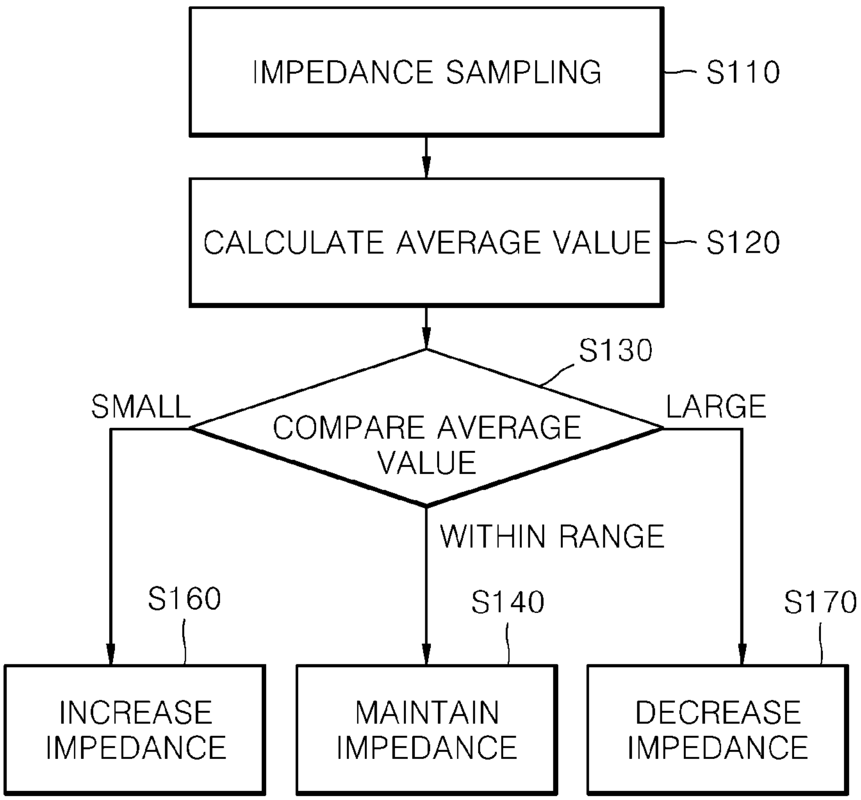

INDUCTIVELY COUPLED PLASMA APPARATUS FOR EXHAUST GAS TREATMENT AND IMPEDANCE MATCHING METHOD THEREOF

TECHNICAL FIELD

The present invention relates to a technique for treating exhaust gas discharged from a process chamber of a semiconductor manufacturing facility using to plasma, and more particularly, to a technique for treating exhaust gas discharged from a process chamber of a semiconductor manufacturing facility using inductively coupled plasma.

BACKGROUND ART

Semiconductor devices are being manufactured by repeatedly performing processes such as photolithography, etching, diffusion, and metal deposition on a wafer in a process chamber. During a semiconductor manufacturing process, various process gases are used, and after the process is completed, a residual gas in the process chamber includes various harmful components such as perfluorinated compounds (PFCs). The residual gas in the process chamber is discharged through an exhaust line by a vacuum pump after the process is completed, and the exhaust gas is purified by an exhaust gas treatment device so that the harmful components are not discharged as they are.

Recently, a technique for decomposing and treating harmful components through a plasma reaction has been widely used. Korean Patent Laid-open Publication No. 2019-19651 discloses a plasma chamber for treating exhaust gas using inductively coupled plasma. Inductively coupled plasma is generated by an electric field generated by a time-varying current flowing through an antenna coil by applying radio frequency power to the antenna coil. In general, an inductively coupled plasma reactor includes a chamber providing a space for generating plasma, a ferrite core coupled to surround the chamber, an antenna coil wound around the ferrite core, and an igniter for initial plasma ignition. The inductively coupled plasma reactor receives high-frequency power from a power supply. In order to efficiently supply power, an impedance between the inductively coupled plasma reactor and the power supply needs to be appropriately matched. In the inductively coupled plasma reactor, the impedance changes depending on a reaction environment. When the impedance of the inductively coupled plasma reactor and the power supply do not match, problems, such as plasma off, reduced power supply, damage of the power supply, inefficient power usage, and a rising pressure in equipment occur. In order to match the impedance of the inductively coupled plasma reactor with the impedance of the power supply, a fully automatic method or a manual method is used in the related art. Since the fully automatic method according to the related art is expensive and the manual method according to the related art is inconvenient to use, improvement is required.

DETAILED DESCRIPTION OF THE INVENTION

Technical Problem

The present invention provides an inductively coupled plasma apparatus for exhaust gas treatment, which is inexpensive compared to an automatic method according to the related art and in which impedance is matched conveniently compared to a manual method according to the related art, and an impedance matching method thereof.

Technical Solution

According to an aspect of the present invention, there is provided an inductively coupled plasma apparatus for exhaust gas treatment, the inductively coupled plasma apparatus including: an inductively coupled plasma apparatus for exhaust gas treatment, the inductively coupled plasma apparatus including: an inductively coupled plasma reactor installed on an exhaust pipe through which exhaust gas generated from a process chamber of a semiconductor manufacturing facility is discharged, and configured to generate inductively coupled plasma to treat the exhaust gas for each repeated operation cycle; a power supply configured to supply high-frequency power to the inductively coupled plasma reactor through a transmission line; and an impedance matching unit configured to match impedance of the inductively coupled plasma reactor with impedance of the power supply, wherein the impedance matching unit includes a variable power storage element, an operation data measuring instrument measuring operation data of the inductively coupled plasma reactor, and a controller stepwise adjusting total capacitance by the variable power storage element using an operation data sampling value obtained by the operation data measuring instrument in one operation cycle and reflecting the adjusted total capacitance on starting impedance matching in a next operation cycle.

According to another aspect of the present invention, there is provided an impedance matching method of an inductively coupled plasma apparatus for exhaust gas treatment including an inductively coupled plasma reactor installed on an exhaust pipe through which exhaust gas generated from a process chamber of a semiconductor manufacturing facility is discharged, and configured to generate inductively coupled plasma to treat the exhaust gas for each repeated operation cycle, a power supply configured to supply high-frequency power to the inductively coupled plasma reactor through a transmission line, and an impedance matching unit configured to match impedance of the inductively coupled plasma reactor with impedance of the power supply, the impedance matching unit including a variable power storage element, an operation data measuring instrument measuring operation data of the inductively coupled plasma reactor, and a controller stepwise adjusting total capacitance by the variable power storage element using an operation data sampling value obtained by the operation data measuring instrument in one operation cycle and reflecting the adjusted total capacitance on starting impedance matching of a next operation cycle, the impedance matching method including: an operation data sampling operation in which the operation data is sampled by the operation data measuring instrument a plurality of times so that a plurality of operation data sampling values are obtained by the controller; an average value calculating operation in which an operation data sampling average value that is an average value of the plurality of operation data sampling values is calculated by the controller; an average value comparing operation in which the operation data sampling average value and a range of preset allowable operation data are compared by the controller; an impedance increasing operation in which, when in the average value comparing operation, it is checked that a sampling average value is less than a minimum value of the allowable operation data, the total capacitance is increased by the controller and is reflected on starting impedance matching of a next operation cycle; and an impedance decreasing operation in which, when in the average value comparing operation, it is checked that a sampling average value is greater than a maximum value of the allowable operation data, the total capacitance is decreased by the controller and is reflected on starting impedance matching in a next operation cycle.

Effects of the Invention

According to the present invention, the objectives of the present invention described above can be achieved. Specifically, by controlling the operation of a plurality of switches for controlling electrical connection of each of a plurality of power storage units by using an average value of a plurality of impedance sampling values, the total capacitance of an impedance matching unit is maintained or maintained after being changed once, so that it is inexpensive compared to an automatic method according to the related art and impedance can be matched conveniently compared to a manual method according to the related art.

DESCRIPTION OF THE DRAWINGS

FIG. 1 illustrates a schematic configuration of a semiconductor manufacturing facility in which an inductively coupled plasma apparatus for exhaust gas treatment according to an embodiment of the present invention is installed.

FIG. 2 illustrates a schematic configuration of an inductively coupled plasma apparatus according to an embodiment of the present invention installed in the semiconductor manufacturing facility shown in FIG. 1.

FIG. 3 illustrates an impedance conversion table stored in a controller of an impedance matching unit provided in the inductively coupled plasma apparatus shown in FIG. 2.

FIG. 4 is a flowchart schematically illustrating an impedance matching method according to an embodiment of the present invention of the inductively coupled plasma apparatus shown in FIG. 2.

MODE OF THE INVENTION

Hereinafter, the configuration and operation of the present invention will be described in detail with reference to the accompanying drawings.

In FIG. 1, a schematic configuration of a semiconductor manufacturing facility in which an inductively coupled plasma apparatus for exhaust gas treatment according to an embodiment of the present invention is installed, is illustrated as a block diagram. Referring to FIG. 1, a semiconductor manufacturing facility F includes a process chamber C in which a semiconductor manufacturing process is performed using various process gases, an exhaust pipe D through which a residual gas generated in the process chamber C is discharged, a scrubber S for treating exhaust gas discharged from the process chamber C through an exhaust pipe D, a vacuum pump P that forms a discharge pressure on the exhaust pipe D so that the residual gas generated in the process chamber C is discharged through the discharge pipe D, and an inductively coupled plasma apparatus 100 according to an embodiment of the present invention, for treating exhaust gas flowing along the exhaust pipe D at an upstream of the vacuum pump P using inductively coupled plasma. The feature of the present invention is the inductively coupled plasma apparatus 100 for exhaust gas treatment, and the process chamber C, the vacuum pump P, the scrubber S, and the exhaust pipe D that are the remaining configurations except for the inductively coupled plasma apparatus 100 in the semiconductor manufacturing facility shown in FIG. 1 may be configured within the ordinary technical scope related to the present invention.

The inductively coupled plasma apparatus 100 treats the exhaust gas flowing along the exhaust pipe D at the upstream of the vacuum pump P using inductively coupled plasma. The configuration of the inductively coupled plasma apparatus 100 is schematically shown in FIG. 2. Referring to FIG. 2, the inductively coupled plasma apparatus 100 includes an inductively coupled plasma reactor 110 installed on the exhaust pipe D, a power supply 120 for supplying high-frequency power to the inductively coupled plasma apparatus 110, and an impedance matching unit 130 for matching an impedance between the inductively coupled plasma reactor 110 and the power supply 120.

The inductively coupled plasma reactor 110 is installed on the exhaust pipe D and treats the exhaust gas flowing through the exhaust pipe D using inductively coupled plasma. The inductively coupled plasma reactor 110 includes that of a configuration generally used in the related art (e.g., Korean Patent Registration No. 10-2155631), a detailed description thereof will be omitted. The inductively coupled plasma reactor 110 generates plasma for treating exhaust gas using high-frequency power supplied from a power supply 120 through a high-frequency transmission line 190. Even if, in the present embodiment, it is described that the inductively coupled plasma reactor 110 is located at more upstream than a vacuum pump P on the exhaust pipe D, unlike this, the inductively coupled plasma reactor 110 may be located at more downstream than the vacuum pump P on the exhaust pipe D, and this also belongs to the scope of the present invention.

The power supply 120 supplies the high-frequency power to the inductively coupled plasma reactor 110 through the high-frequency transmission line 190 so that inductively coupled plasma can be generated in the inductively coupled plasma reactor 110.

The impedance matching unit 130 is installed on the high-frequency transmission line 190 so that the high-frequency power can be effectively transmitted from the power supply 120 to the inductively coupled plasma reactor 110 to match impedance at the inductively coupled plasma reactor 110 and impedance at the power supply 120. The impedance matching unit 130 includes an inductor 140 connected in series to the high-frequency transmission line 190, a plurality of power storage units 151, 152, and 153 connected in parallel to the high-frequency transmission line 190, a plurality of switches 161, 162, and 163 for controlling electrical connection between each of the plurality of power storage units 151, 152, and 153 and the high-frequency transmission line 190, an impedance measuring instrument 170 for measuring impedance by detecting a voltage and a current of power transmitted from the inductively coupled plasma reactor 110 to the power supply 120, and a controller 180 for controlling the operation of the plurality of switches 161, 162, and 163 using impedance data measured by the impedance measuring instrument 170.

The inductor 140 is connected in series to the high-frequency transmission line 190 and provides inductance (inductive capacity) fixed in the impedance matching unit 130.

The plurality of power storage units 151, 152, and 153 are sequentially connected to the high-frequency transmission line 190, and each of the power storage units 151, 152, and 153 is connected in parallel to the high-frequency transmission line 190. In the present embodiment, there are three power storage units 151, 152, and 153. However, the present invention is not limited thereto, and there may be two, or four or more power storage units, and this also belongs to the scope of the present invention. In the present embodiment, one power storage unit 151 among three power storage units 151, 152, and 153 is referred to as a first power storage unit, another power storage unit 152 is referred to as a second power storage unit, and the other power storage unit 153 is referred to as a third power storage unit. The first power storage unit 151 provides a fixed first capacitance (electric capacity) C1, the second power storage unit 152 provides a fixed second capacitance C2, and the third power storage unit 153 provides a fixed third capacitance C3. The first capacitance C1, the second capacitance C2, and the third capacitance C3 have different values. In the present embodiment, it is described that the second capacitance C2 is greater than the first capacitance C1 and the third capacitance C3 is greater than the second capacitance C2. The plurality of power storage units 151, 152, and 153 constitute a variable power storage element.

In the present embodiment, it is described that the first power storage unit 151 includes one capacitor having the first capacitance C1, but the present invention is not limited thereto. The first power storage unit 151 may be configured to include a plurality of capacitors that are connected in series, in parallel to each other or in a serial-parallel mixed manner to have the first capacitance C1, and this also belongs to the scope of the present invention.

In the present embodiment, it is described that the second power storage unit 152 includes one capacitor having the second capacitance C2, however, the present invention is not limited thereto. The second power storage unit 152 may be configured to include a plurality of capacitors that are connected in series, in parallel to each other or in a serial-parallel mixed manner to have the second capacitance C2, and this also belongs to the scope of the present invention.

In the present embodiment, it is described that the third power storage unit 153 includes one capacitor having the third capacitance C3. However, the present invention is not limited thereto. The third power storage unit 153 may include a plurality of capacitors that are connected in series, in parallel to each other or in a serial-parallel mixed manner to have the third capacitance C3, and this also belongs to the scope of the present invention.

Each of the plurality of switches 161, 162, and 163 is installed in a one-to-one correspondence with each of the plurality of power storage units 151, 152, and 153 to control electrical connection between each of the plurality of power storage units 151, 152, and 153 and the high-frequency transmission line 190. In the present embodiment, it is described that the plurality of switches 161, 162, and 163 are three corresponding to the number of the power storage units 151, 152, and 153, and the number of the switches 161, 162, and 163 may be changed to correspond to the number of the power storage units 151, 152, and 153. In the present embodiment, the switch 161 corresponding to the first power storage unit 151 among three switches 161, 162, and 163 is referred to as a first switch, the switch 162 corresponding to the second power storage unit 152 among three switches 161, 162, and 163 is referred to as a second switch, and the switch 163 corresponding to the third power storage unit 153 among three switches 161, 162, and 163 is referred to as a third switch. That is, the first switch 161 controls electrical connection between the first storage unit 151 and the high-frequency transmission line 190, the second switch 162 controls electrical connection between the second power storage unit 152 and the high-frequency transmission line 190, and the third switch 163 controls electrical connection between the third power storage unit 153 and the high-frequency transmission line 190. An on/off operation of the first switch 161, the second switch 162, and the third switch 163 is independently controlled by the controller 180. Total capacitance by the first, second, and third power storage units 151, 152, and 153 has eight values, as in a table shown in FIG. 3, according to an on/off state of each of the first switch 161, the second switch 162, and the third switch 163. Referring to FIG. 3, because C1<C2<C3, total capacitance has a large value sequentially from CASE 1 to CASE 8 according to on/off states of the first switch 161, the second switch 162, and the third switch 163. Total capacitance data according to the switch on/off state shown in FIG. 3 is stored in the controller 180.

The impedance measuring instrument 170 measures impedance by detecting the voltage/current of power transmitted from the inductively coupled plasma reactor 110 to the power supply 120. Because measurement and matching of the impedance through voltage/current detection includes a generally-used configuration, a detailed description thereof will be omitted.

The controller 180 independently controls the operation of each of the first, second, and third switches 161, 162, and 163 using an impedance value measured by the impedance measuring instrument 170. The controller 180 may include a computer program for performing an impedance matching method in a hardware manner, a memory device in which the table data shown in FIG. 3 and data of an appropriate range of impedance generated in the inductively coupled plasma reactor 110 are stored, and a central processing unit (CPU) for performing a computer program for performing the impedance matching method stored in the memory device. The impedance matching method according to an embodiment of the present invention is performed by the controller 180, and a detailed operation of the controller 180 will be described in detail through the impedance matching method shown in FIG. 4.

FIG. 4 is a flowchart schematically illustrating the impedance matching method according to an embodiment of the present invention of the inductively coupled plasma apparatus shown in FIG. 2. Referring to FIG. 2 together with FIG. 4, the impedance matching method of the inductively coupled plasma apparatus according to an embodiment of the present invention includes an impedance sampling operation S110 in which impedance output from the inductively coupled plasma reactor 110 is sampled a plurality of times and is obtained as a plurality of impedance sampling values, an average value calculating operation S120 in which an impedance sampling average value that is an average value of the plurality of impedance sampling values obtained through the impedance sampling operation S110 is calculated, an average value comparing operation S130 in which the impedance sampling average value calculated through the average value calculating operation S120 is compared with a preset allowable impedance, an impedance maintaining operation S140 in which total capacitance of the impedance matching unit 130 is maintained without changes according to a comparison result in the average value comparing operation S130, an impedance increasing operation S160 in which total capacitance of the impedance matching unit 130 is increased according to the comparison result in the average value comparing operation S130, and an impedance decreasing operation S170 in which total capacitance of the impedance matching unit 130 is decreased according to the comparison result in the average value comparing operation S130. Each of operations of the impedance matching method shown in FIG. 4 is performed for one operation cycle of the inductively coupled plasma reactor 110.

In the impedance sampling operation S110, reflected power output from the inductively coupled plasma reactor 110 is sampled a plurality of times so that a plurality of impedance sampling values are obtained. In the impedance sampling operation S110, in one cycle operation section of the inductively coupled plasma reactor 110, after a preset certain time elapses after the operation of the inductively coupled plasma reactor 110 starts, the impedance measuring instrument 170 samples impedance from inductively coupled plasma 120 a plurality of times according to a reflected power measuring instruction transmitted from the controller 180 to the impedance measuring instrument 170, and the controller 180 obtains a plurality of impedance sampling values sampled by the impedance measuring instrument 170.

In the average value calculating operation S120, an impedance sampling average value that is an average value of the plurality of impedance sampling values obtained through the impedance sampling operation S110 by using the controller 180.

In the average value comparing operation S130, the impedance sampling average value calculated through the average value calculating operation S120 is compared with a range (from an allowable impedance minimum value RP_min to an allowable impedance maximum value RP_max) of the preset allowable impedance. In the average value comparing operation S130, when it is checked that the impedance sampling average value is within the range of the present allowable impedance, the impedance maintaining operation S140 is performed, and when it is checked that the impedance sampling average value is less than the allowable impedance minimum value RP_min, the impedance increasing operation S160 is performed, and when it is checked that the impedance sampling average value is greater than the allowable impedance maximum value RP_max, the impedance decreasing operation S170 is performed.

In the impedance maintaining operation S140, total capacitance of the impedance matching unit 130 is maintained without changes. The impedance maintaining operation S140 is performed when the controller 180 outputs a switch control signal for maintaining on/off states of the plurality of switches 161, 162, and 163 without changes. At an initial stage, the impedance maintaining operation S140 may be an operation in which total capacitance has a value C3, for example, in FIG. 3, when all of the switches 161, 162 and 163 are turned off. Total capacitance of the impedance matching unit 130 maintained through the impedance maintaining operation S140 is maintained until one cycle operation of the inductively coupled plasma reactor 110 ends and the average value comparing operation S130 is performed in a next cycle.

In the impedance increasing operation S160, total capacitance of the impedance matching unit 130 is increased. The impedance increasing operation S160 is performed when the controller 180 changes the on/off states of the plurality of switches 161, 162, and 163 to be increased compared to total capacitance initially set based on the table shown in FIG. 3 from the on/off initial states of the plurality of switches 161, 162, and 163. In the impedance increasing operation S160, an increase in total capacitance of the impedance matching unit 130 may be performed in proportion to the size of a value in which the impedance sampling average value is less than the allowable impedance minimum value RP_min. That is, the greater the size of the value in which the impedance sampling average value is less than the allowable impedance minimum value RP_min, the greater an increase value in total capacitance of the impedance matching unit 130. In other words, when the initially set total capacitance of the impedance matching unit 130 is CASE 4 having the value C3 in FIG. 3, if the degree of the impedance sampling average value is less than the allowable impedance minimum value RP_min is relatively small, the initially set total capacitance of the impedance matching unit 130 is changed to CASE 5 with total capacitance of C1+C2, and if the degree of the impedance sampling average value is less than the allowable impedance minimum value RP_min is relatively very large, the initially set total capacitance of the impedance matching unit 130 may be changed to CASE 8 with total capacitance of C1+C2+C3. Total capacitance of the impedance matching unit 130 increasing once through the impedance increasing operation S160 is maintained until one cycle operation of the inductively coupled plasma reactor 110 ends and the average value comparing operation S130 is performed in a next cycle.

In the impedance decreasing operation S170, total capacitance of the impedance matching unit 130 is decreased. The impedance decreasing operation S170 is performed by changing the on/off states of the plurality of switches 161, 162, and 163 so that total capacitance of the impedance matching unit 130 is decreased compared to the initially set based on the table shown in FIG. 3 from the initial on/off states of the plurality of switches 161, 162, and 163. In the impedance decreasing operation S170, a decrease in total capacitance of the impedance matching unit 130 may be performed in proportion to the size of a value in which the impedance sampling average value is greater than the allowable impedance maximum value RP_max. That is, the greater the size of the value in which the impedance sampling average value is greater than the allowable impedance maximum value RP_max, the greater a decrease value in total capacitance of the impedance matching unit 130. In other words, when total capacitance of the initially set impedance matching unit 130 is CASE 4 having the value C3 in FIG. 3, and if the degree of the impedance sampling average value is greater than the allowable impedance minimum value RP_min is relatively small, the initially set total capacitance of the impedance matching unit 130 is changed to CASE 4 with total capacitance of C3, and if the degree of the impedance sampling average value is greater than the allowable impedance minimum value RP_min is relatively very large, the initially set total capacitance of the impedance matching unit 130 may be changed to CASE 1 with total capacitance of 0. Total capacitance of the impedance matching unit 130 decreasing once through the impedance decreasing operation S170 is maintained until one cycle operation of the inductively coupled plasma reactor 110 ends and the average value comparing operation S130 is performed in a next cycle.

In the above-described embodiment, it is described that the controller 180 performs impedance matching using the voltage/current generated from the inductively coupled plasma reactor 110 measured by the impedance measuring instrument 170. However, the present invention is not limited to using impedance for impedance matching. The impedance measured by the impedance measuring instrument 170 may be an example of operation data about the inductively coupled plasma reactor 110 measured to perform impedance matching according to the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. An inductively coupled plasma apparatus for exhaust gas treatment, the inductively coupled plasma apparatus comprising:

an inductively coupled plasma reactor installed on an exhaust pipe through which exhaust gas generated from a process chamber of a semiconductor manufacturing facility is discharged, and configured to generate inductively coupled plasma to treat the exhaust gas for each repeated operation cycle;

a power supply configured to supply high-frequency power to the inductively coupled plasma reactor through a transmission line; and an impedance matching unit configured to match impedance of the inductively coupled plasma reactor with impedance of the power supply, wherein the impedance matching unit comprises a variable power storage element, an operation data measuring instrument measuring operation data of the inductively coupled plasma reactor, and a controller stepwise adjusting total capacitance by the variable power storage element using an operation data sampling value obtained by the operation data measuring instrument in one operation cycle and reflecting the adjusted total capacitance on starting impedance matching in a next operation cycle, wherein the operation data measuring instrument measures impedance through voltage and current of the reflected power transmitted from the inductively coupled plasma reactor to the power supply, and the operation data sampling value is an impedance sampling value, wherein a plurality of impedance sampling values are obtained by the operation data measuring instrument, and the controller adjusts the total capacitance using an impedance sampling average value that is an average value of the plurality of impedance sampling values, wherein the variable power storage element includes a plurality of power storage units sequentially connected in parallel to the transmission line, and each of a plurality of switches installed in a one-to-one correspondence with each of the plurality of power storage units to control electrical connection between each of the plurality of power storage units and the transmission line, and the controller controls an on/off state of each of the plurality of switches to adjust the total capacitance, and wherein the controller compares the impedance sampling average value with a range of a preset allowable impedance, when the impedance sampling average value is within the allowable impedance range, the controller maintains initial on/off states of the plurality of switches, and when the impedance sampling average value is outside the allowable impedance range, the controller changes the initial on/off states of the plurality of switches.

2. The inductively coupled plasma apparatus of claim 1, wherein the impedance matching unit adjusts the total capacitance so that reflected power generated from the inductively coupled plasma reactor is reduced.

3. The inductively coupled plasma apparatus of claim 1, wherein, when the impedance sampling average value is less than an allowable impedance minimum value, the controller changes the initial on/off states of the plurality of switches to increase the total capacitance.

4. The inductively coupled plasma apparatus of claim 3, wherein, as a difference between the impedance sampling average value and the allowable impedance minimum value increases, the controller changes the initial on/off states of the plurality of switches so that an increase value of the total capacitance further increases.

5. The inductively coupled plasma apparatus of claim 1, wherein, when the impedance sampling average value is greater than the allowable impedance maximum value, the controller changes the initial on/off states of the plurality of switches so that the total capacitance is reduced.

6. The inductively coupled plasma apparatus of claim 5, wherein, as a difference between the impedance sampling average value and the allowable impedance maximum value increases, the controller changes the initial on/off states of the plurality of switches so that a decrease value of the total capacitance further increases.

7. The inductively coupled plasma apparatus of claim 1, wherein the plurality of power storage units have different capacitances.

8. An impedance matching method of an inductively coupled plasma apparatus for exhaust gas treatment including an inductively coupled plasma reactor installed on an exhaust pipe through which exhaust gas generated from a process chamber of a semiconductor manufacturing facility is discharged, and configured to generate inductively coupled plasma to treat the exhaust gas for each repeated operation cycle, a power supply configured to supply high-frequency power to the inductively coupled plasma reactor through a transmission line, and an impedance matching unit configured to match impedance of the inductively coupled plasma reactor with impedance of the power supply, the impedance matching unit comprising a variable power storage element, an operation data measuring instrument measuring operation data of the inductively coupled plasma reactor, and a controller stepwise adjusting total capacitance by the variable power storage element using an operation data sampling value obtained by the operation data measuring instrument in one operation cycle and reflecting the adjusted total capacitance on starting impedance matching of a next operation cycle, the impedance matching method comprising:

an operation data sampling operation in which the operation data is sampled by the operation data measuring instrument a plurality of times so that a plurality of operation data sampling values are obtained by the controller;

an average value calculating operation in which an operation data sampling average value that is an average value of the plurality of operation data sampling values is calculated by the controller;

an average value comparing operation in which the operation data sampling average value and a range of preset allowable operation data are compared by the controller;

an impedance increasing operation in which, when in the average value comparing operation, it is checked that a sampling average value is less than a minimum value of the allowable operation data, the total capacitance is increased by the controller and is reflected on starting impedance matching of a next operation cycle; and an impedance decreasing operation in which, when in the average value comparing operation, it is checked that a sampling average value is greater than a maximum value of the allowable operation data, the total capacitance is decreased by the controller and is reflected on starting impedance matching in a next operation cycle.

9. The impedance matching method of claim 8, wherein the operation data measuring instrument measures impedance through voltage and current of the reflected power transmitted from the inductively coupled plasma reactor to the power supply, and the operation data sampling value is an impedance sampling value, and the operation data sampling average value is an impedance sampling average value, and, when in the average value comparing operation, it is checked that the impedance sampling average value is less than a minimum value of the allowable operation data, it is determined that an increase of the total capacitance is necessary, and when in the average value comparing operation, it is checked that the impedance sampling average value is greater than a maximum value of the allowable operation data, it is determined that a decrease of the total capacitance is necessary.

10. The impedance matching method of claim 9, wherein, in the impedance increasing operation, as a difference between the impedance sampling average value and the allowable impedance minimum value increases, an increase value of the total capacitance further increases.

11. The impedance matching method of claim 9, wherein, in the impedance decreasing operation, as a difference between the impedance sampling average value and the allowable impedance maximum value increases, a decrease value of the total capacitance further increases.

* * * * *